United States Patent [19]
De Graaff

[11] 3,868,725
[45] Feb. 25, 1975

[54] INTEGRATED CIRCUIT LEAD STRUCTURE

[75] Inventor: Philip Johan De Graaff, Nijmegen, Netherlands

[73] Assignee: U.S. Philips Corporation, New York, N.Y.

[22] Filed: Jan. 14, 1974

[21] Appl. No.: 433,387

Related U.S. Application Data

[63] Continuation of Ser. No. 294,911, Oct. 4, 1972, abandoned.

[30] Foreign Application Priority Data

Oct. 14, 1971 Netherlands ........................ 7114112

[52] U.S. Cl. ........................ 357/68, 357/72, 357/74, 357/79, 357/81, 174/525

[51] Int. Cl. ............................ H01l 3/00, H01l 5/00

[58] Field of Search ................ 317/234, 1, 3, 3.1, 4, 317/4.1, 5, 5.4, 6; 174/525

[56] References Cited

UNITED STATES PATENTS

| | | | |
|---|---|---|---|
| 3,192,307 | 6/1965 | Lazar | 317/234 N |
| 3,290,564 | 12/1966 | Wolff | 317/234 G |
| 3,387,365 | 6/1968 | Stelmak | 317/234 G |
| 3,478,420 | 11/1969 | Grimes et al. | 317/234 N |
| 3,512,053 | 5/1970 | Andersson et al. | 317/234 P |
| 3,544,857 | 12/1970 | Byrne et al. | 317/234 G |
| 3,662,230 | 5/1972 | Redwantz | 317/234 H |
| 3,683,105 | 8/1972 | Shamash et al. | 317/234 G |

*Primary Examiner*—Andrew J. James
*Attorney, Agent, or Firm*—Frank R. Trifari

[57] ABSTRACT

The semiconductor device comprises an insulating foil on which a pattern of conductor tracks is present and a semiconductor body with contact places which are connected to facing ends of the conductor tracks. External conductors are connected to the other ends of the conductor tracks and consist of flat strips which project from an envelope on oppositely located envelope sides, the conductors being provided with a holding element on their end facing the foil, the distance of holding elements of oppositely located conductors being smaller than the foil width at that area. A cooling plate against which the semiconductor body bears with its side remote from the contact places is present near a wall of the envelope.

5 Claims, 2 Drawing Figures

INTEGRATED CIRCUIT LEAD STRUCTURE

This is a continuation of application Ser. No. 294,911, filed 10-4-72 now abandoned.

The invention relates to a semiconductor device comprising an insulating foil on which a pattern of conductor tracks is present, a semiconductor body having contact places which are connected to facing ends of the conductor tracks, external conductors which are connected to the other ends of the conductor tracks and an envelope for the semiconductor body, the foil and a part of the conductors.

In manufacturing such a known semiconductor device provided with an envelope of a synthetic material, the conductor tracks of the foil are connected to leads incorporated in a lead frame, which leads extend to near the semiconductor body. Such a lead frame is rather complicated and hence comparatively expensive. Furthermore, in the case of a foil having a different pattern of conductor tracks, an adapted lead frame must be used. Furthermore, in the known semiconductor device no measures are taken to obtain a good cooling of the semiconductor body so that only a small power is obtained.

In another known semiconductor device having a foil incorporated in a synthetic material and having conductor tracks to which a semiconductor body is secured, the external conductors are also provided on the foil and that as thickened parts. The manufacture of the foil with the conductor tracks and external conductors is complicated. In this embodiment also no measures are taken to obtain a good cooling.

It is the object of the invention to provide a semiconductor device the manufacture of which is considerably simpler than in known semiconductor devices of the type mentioned in the preamble and in which at the same time very efficacious measures are taken to obtain a good cooling of the semiconductor body.

In order to reach the end in view, according to the invention the conductors consist of flat strips which project from the envelope an oppositely located envelope sides, the conductors comprising, on their end facing the foil, a holding element for the foil, the distance of holding elements of oppositely located conductors being smaller than the foil width at that area, a cooling plate against which the semiconductor body bears with its side remote from the contact places being present near a wall of the envelope.

Comb-shaped strips are preferably used as conductors in the manufacture; the foil is secured to two or more equal combs which face each other with the holding elements. The manufacture of these combs is simple. For semiconductor devices which do not all have an equal number of external conductors, a number of adapted combs need not be manufactured but a greater or smaller part of a comb-shaped strip is simply used on which thus a greater or smaller number of conductor parts is present. The holding elements enable a simple connection of the foil to the conductors. The use of two or more combs furthermore creates the possibility of bringing the holding elements at a desirable distance from each other, the foil being not tautly stretched but sagging to a desirable extent. The semiconductor body secured to the foil can now be pressed against a cooling plate with its side remote from the contact places without any possibility of damage. As a result of the sagging foil, the cooling plate need not be present in the plane of the conductors, but may be provided on the outside of the envelope, which is considerably more favourable for the heat dissipation.

In an embodiment according to the invention, the holding elements consist of beak-like parts provided in the end of the strips. These holding elements can be provided in the conductors in a simple manner.

In a further embodiment, the side of the semiconductor body remote from the contact places is rigidly secured to the cooling plate. This connection may consist, for example, of a soldered joint or of a joint by means of a heat-conducting glue.

In another embodiment the envelope consists of a synthetic material, one of the flat sides of the cooling plate coinciding with an outer surface of the envelope. In this case the manufacture of the envelope is little complicated, while the cooling capacity is optimum.

In a further embodiment the envelope consists of a box-like housing, the cooling plate being incorporated in the wall present near the semiconductor body and the oppositely located wall comprising a projection which extends in the envelope and presses the semiconductor body against the cooling plate with its side remote from the contact places.

The box-like housing which consists, for example, of a synthetic material, may be constructed from two parts, the conductors being secured in the interface during sealing. The semiconductor device may be manufactured with simple tools. Variation of the box shape while maintaining the same comb can be realized without great investments. If desirable, the inner part of the housing may be filled with a filling mass, for example, a synthetic material.

The invention will be described in greater detail with reference to a few embodiments shown in the drawing.

Figure 1:
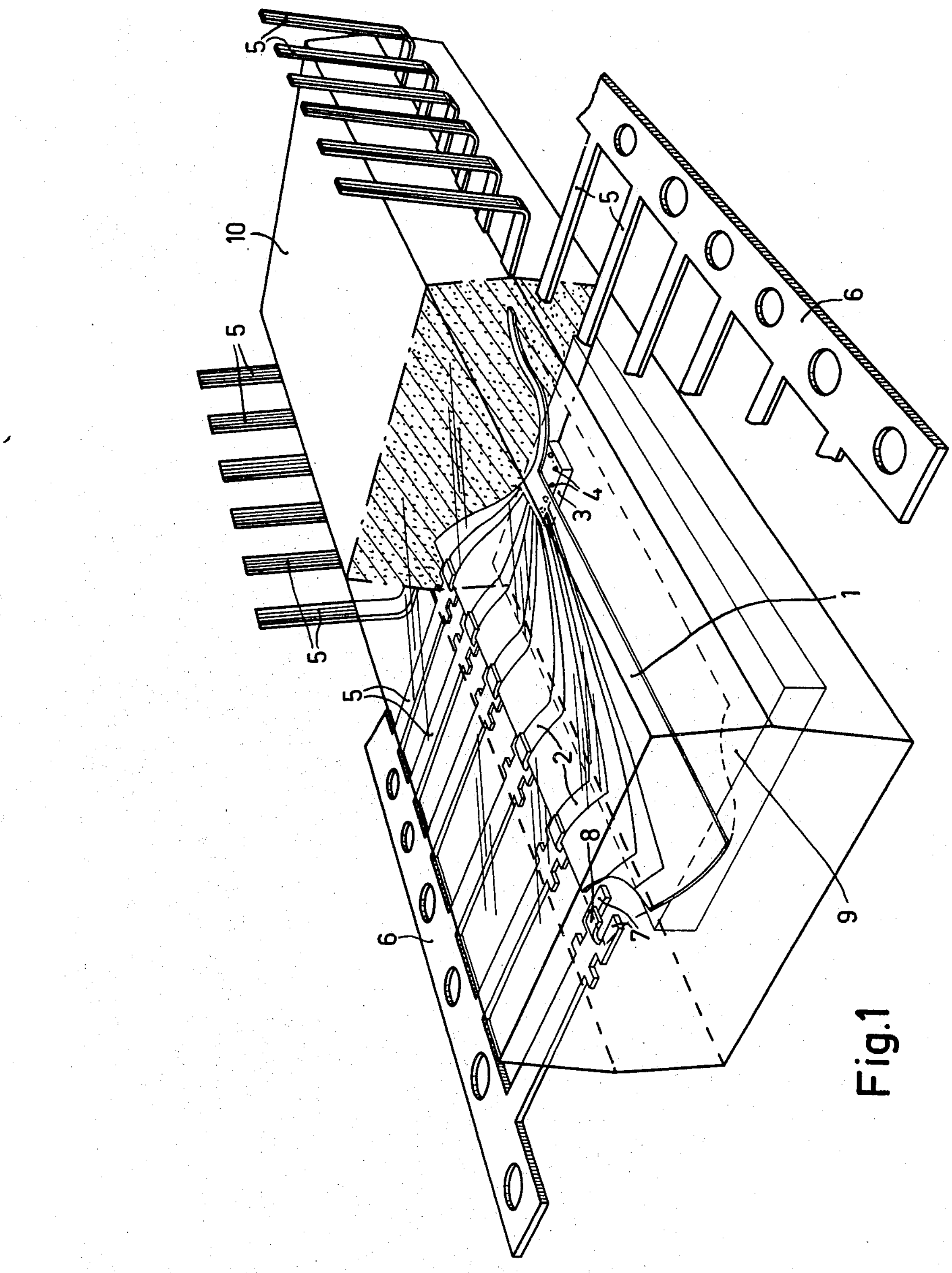
FIG. 1 is a perspective view of a first embodiment of the semiconductor device.

In the semiconductor device shown in FIG. 1, a foil 1, for example, a polyimide foil, is provided with a pattern of metal conductor tracks 2. A semiconductor body 3 comprising an integrated circuit has contact places 4. Said contact places are connected to ends of the conductor tracks facing the semiconductor body, for example, by means of a soldered joint. A row of external conductors 5 which, during the manufacture of the semiconductor device, are connected by a supporting strip 6 and each constitute a so-called conductor comb, are present on two oppositely located sides of the semiconductor device. Said combs may consist of a metal having a low electric resistance; the mutual distance of the conductors, which distance may be standardized, is usually 2.54 mm. Of such a comb-like strip a part is taken which has the desired number of conductors. The same comb-like strip may thus be used for semiconductor devices having any desired number of external conductors.

The ends of the conductors 5 facing the foil 1 are provided with holding elements 7, 8 for the foil. The holding elements shown in the drawing consist of beak-like portions. Of course, the holding elements may also be constructed differently. The foil 1 is clamped between the beak-like portions 7, 8, the end of the conductor tracks present at the foil edge and the portion 8 of the beaks contacting each other. Said portions 8 can be connected in an electrically conducting manner to the conductor tracks 2 by means of a soldered joint.

Oppositely located holding elements are present at a distance which is smaller than the width of the foil 1, so that the foil can sag. In this manner it is enabled that the side of the semiconductor body 3 remote from the contact places 4 engages a cooling plate 9 the outer surface of which coincides with an outer surface of an envelope 10 of a synthetic material. The semiconductor body may be secured, for example, to the cooling plate by means of a soldered or a glued joint, or bear freely under pressure against the cooling plate. After enveloping, the supporting strip 6 is removed from the conductors 5 and the conductors are bent, if desirable so that they can be mounted in apertures of a printed circuit mounting panel.

Figure 2:
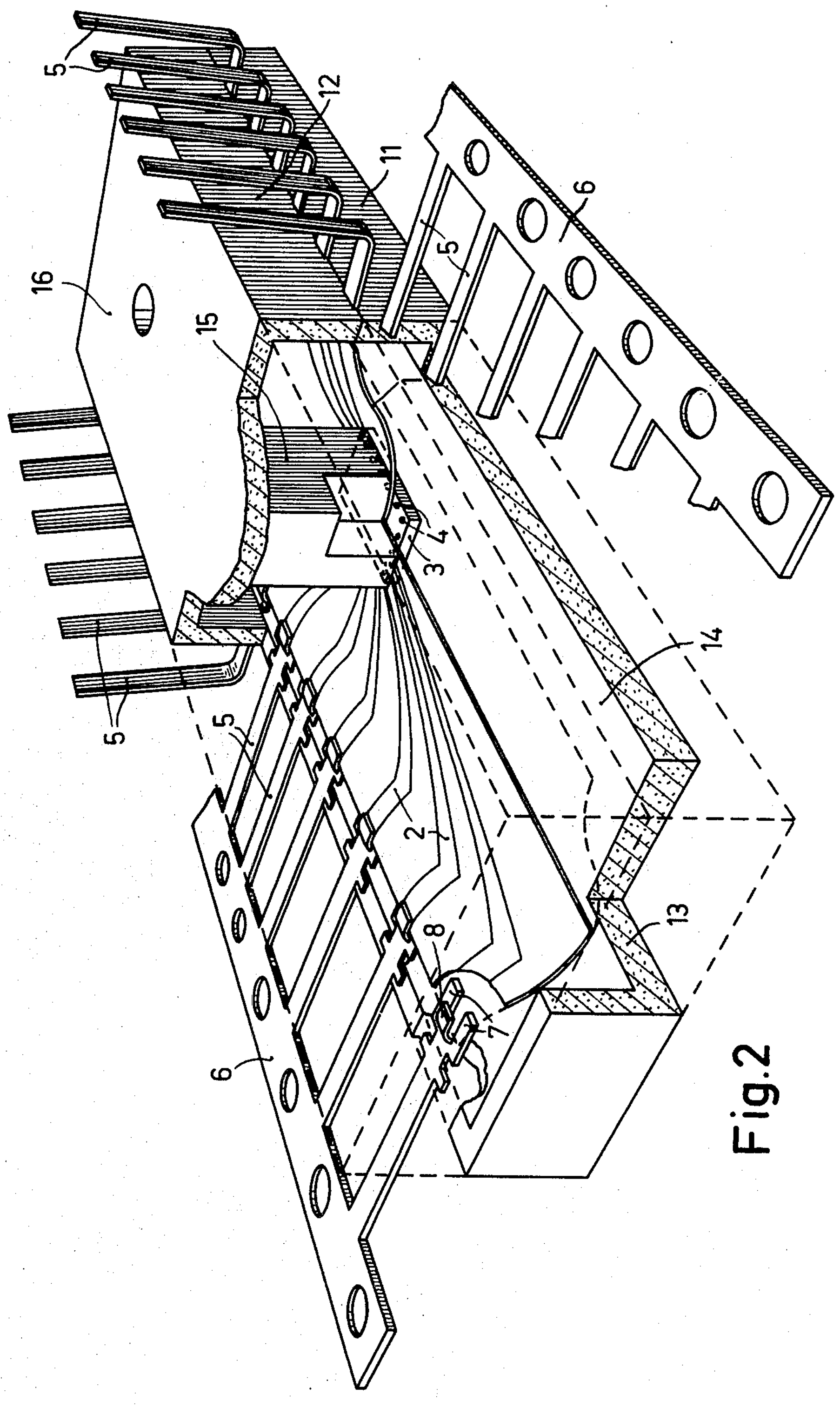
FIG. 2 is a perspective view of a second embodiment.

FIG. 2 shows a second embodiment in which corresponding parts are referred to by the same reference numerals as in FIG. 1.

The conductors 5 the holding elements 7, 8 of which support the foil are present between the upright walls 11, 12 of a housing which consists of two parts. A semiconductor body 3 is again present on the foil 1, the contact places 4 being secured to the conductor tracks 2. In the bottom 13 of the lower part of the housing a cooling plate 14 is incorporated. The housing may preferably consist of a thermoplastic material, the cooling plate 14 being moulded in the bottom 13 of the lower housing. The cooling plate 14 can also be incorporated in the bottom 13 in a different manner, for example, by means of a snap fastener. The upper housing comprises a projection 15. Upon assembling the two parts of the housing, the projection 15 presses the side of the semiconductor body 3 remote from the contact places 4 against the cooling plate 14, the cover 16 of the upper housing serving as a spring and ensuring a permanent pressure. The semiconductor body 3 may also be glued to the cooling plate 14, for example, by means of a heat-conducting glue, by means of the pressure exerted by the projection 15. After welding the upright walls 11, 12 of the upper and lower housing together, in which the conductors 5 are also secured in the housing, the envelope is ready. If desirable, the envelope may be provided with a filling mass, for example, a synthetic material.

The semiconductor devices described having a number of advantages over other semiconductor devices in which a foil is used. The manufacture of combs is considerably simpler than the manufacture of a lead frame. Furthermore, a part of a comb may be used which contains the desired number of external conductors. In the case of a conductor grid and a different number of external conductors, an adapted grid must be used. The combs can be placed at such a distance from each other that the foil sags sufficiently to make a heat-conducting contact with the cooling plate. Since a very favourable solution is found for the heat dissipation, the power of the semiconductor device can be great. The envelope may also be provided with external conductors projecting on its four sides. In that case four comb portions may be used. Instead of the combs, separate strip-like conductors may also be used. The assembly is then slightly more complicated, but the cost of separate conductors is lower than that of combs.

What is claimed is:

1. An integrated circuit lead structure for providing externally available electrical access to a plurality of spaced contact areas on one surface of an integrated circuit semiconductor body while providing a heat dissipation path from an opposing surface thereof, comprising:

a flexible insulating foil having opposing edges, said foil supporting a pattern of spaced flexible conductor tracks arranged into two groups of tracks extending respectively from said opposing edges of said foil toward the center thereof;

two patterns of spaced conductor strips having first and second ends, said first ends positionally corresponding with and respectively gripping said two groups of tracks at said opposing edges of said foil, said first ends of said conductor strips being positioned in a plane spaced from said one surface of a semiconductor body, said patterns being spaced from one another by a distance less than the foil dimension therebetween, thereby allowing said foil to sag toward said semiconductor body, the centrally located ends of said tracks terminating at and being in electrical contact with said spaced contact areas on said semiconductor body;

a heat conductive plate in thermal contact with and supporting said opposing surface of said semiconductor body; and an envelope sealed to said plate to form therewith an enclosure encasing said semiconductor body and said foil, said envelope supporting said conductor strips adjacent said first ends, whereby electrical access is provided from said second ends of said strips to said contact areas and said plate provides a heat dissipation path from said semiconductor body.

2. An integrated circuit lead structure as defined in claim 1 wherein each of said first ends of said strips includes a holding element for gripping an edge of said foil at a conductive track and for making electrical contact with said track.

3. An integrated circuit lead structure as defined in claim 2 wherein said holding element comprises beak-like prongs between which said foil and track are gripped.

4. An integrated circuit lead structure as defined in claim 1 wherein said opposing surface of said semiconductor body is attached to one side of said plate, the opposite side of said plate being externally exposed.

5. An integrated circuit lead structure as defined in claim 1 wherein said envelope has first and second parts, said first part thereof supporting said heat conductive plate and forming therewith one portion of a box-like enclosure having walls extending to and supporting said conductor strips adjacent said first ends thereof, said second part of said envelope cooperating with said walls of said first part thereof to hold said semiconductor strips therebetween and to form therewith said box-like enclosure, said second part further comprising an inwardly extending member which presses said foil against said one surface of said semiconductor body, thereby maintaining said tracks in electrical contact with said spaced contact areas on said semiconductor body.

* * * * *